United States Patent
Fukuhara

(10) Patent No.: US 7,072,040 B2
(45) Date of Patent: Jul. 4, 2006

(54) MASK FOR INSPECTING AN EXPOSURE APPARATUS, A METHOD OF INSPECTING AN EXPOSURE APPARATUS, AND AN EXPOSURE APPARATUS

(75) Inventor: Kazuya Fukuhara, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/958,594

(22) Filed: Oct. 6, 2004

(65) Prior Publication Data

US 2005/0099613 A1 May 12, 2005

(30) Foreign Application Priority Data

Oct. 7, 2003 (JP) ............... 2003-348132

(51) Int. Cl.
*G01B 11/00* (2006.01)
*G01B 27/42* (2006.01)
*G03F 1/00* (2006.01)

(52) U.S. Cl. ............... 356/364; 356/399; 356/401; 355/53; 355/55; 430/5

(58) Field of Classification Search ........ 356/399–401, 356/356–369; 430/5; 355/53, 55, 67, 77
See application file for complete search history.

(56) References Cited

U.S. PATENT DOCUMENTS

| | | | |
|---|---|---|---|
| 5,459,000 A * | 10/1995 | Unno | ............... 430/5 |
| 6,048,651 A | 4/2000 | Brunner et al. | |
| 6,317,198 B1 | 11/2001 | Sato et al. | |
| 6,884,552 B1 * | 4/2005 | Mieher et al. | ............... 430/5 |

FOREIGN PATENT DOCUMENTS

| | | |
|---|---|---|
| JP | 2836483 | 10/1998 |
| JP | 3246615 | 11/2001 |

* cited by examiner

*Primary Examiner*—Layla G. Lauchman
(74) *Attorney, Agent, or Firm*—Finnegan, Henderson, Farabow, Garrett & Dunner, L.L.P.

(57) ABSTRACT

To inspect the polarization state of light flux for exposure of an exposure apparatus, a mask for inspection is held at the photomask position. This mask for inspection comprises a polarizing element which is disposed in a light path of light flux forming an image of a light source and which can selectively transmit light flux with a plurality of polarization directions.

20 Claims, 12 Drawing Sheets

FIG. 10A
FIG. 10B
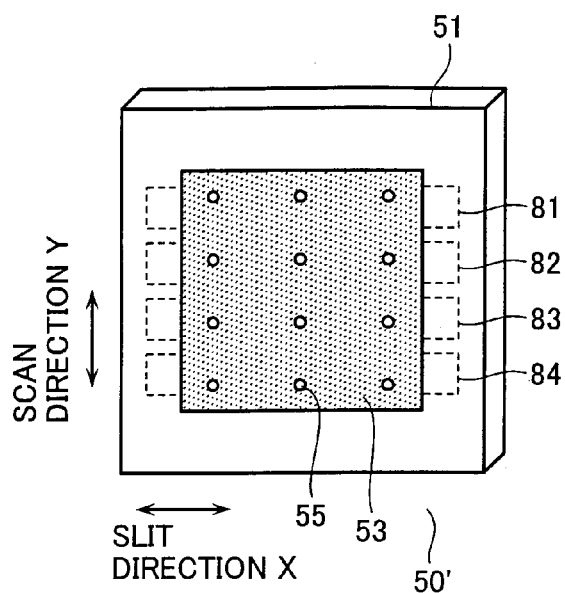
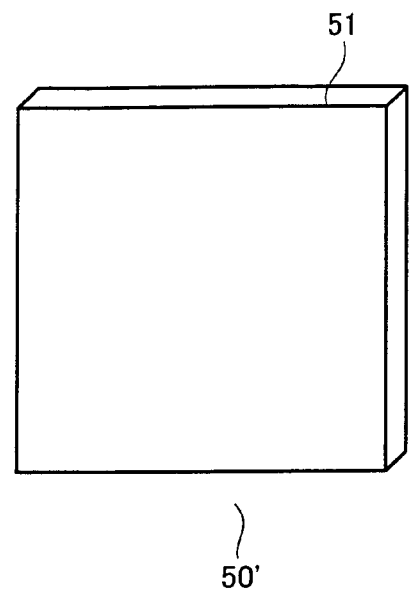
FIG. 11
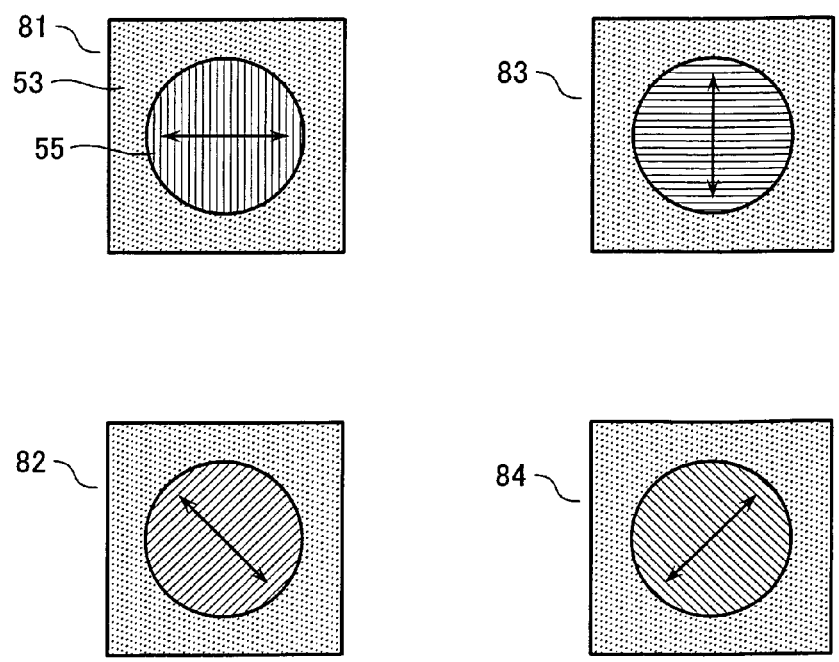

MASK FOR INSPECTING AN EXPOSURE APPARATUS, A METHOD OF INSPECTING AN EXPOSURE APPARATUS, AND AN EXPOSURE APPARATUS

CROSS-REFERENCE TO PRIOR APPLICATION

This application is based upon and claims the benefit of priority from the prior Japanese Patent Application No. 2003-348132, filed on Oct. 7, 2003, the entire content of which is incorporated herein by reference.

BACKGROUND OF THE INVENTION

1. Field of the Invention

The present invention relates to a method of inspecting an exposure apparatus which exposes an object to be exposed such as a wafer through a mask pattern, a mask for inspecting an exposure apparatus, and an exposure apparatus.

2. Description of the Related Art

An exposure apparatus is known to form images with different characteristics on an object to be exposed, depending on the polarization state of the projection light. For example, for an exposure with two-beam interference using TM wave 111 (p-polarization) projection light or TE wave 112 (s-polarization) projection light, as shown in FIG. 14, the latter is known to provide a higher contrast interference wave. The term TM wave refers to light with its electric vector vibration direction being parallel to the plane of incidence. The term TE wave refers to light with its electric vector vibration direction being perpendicular to the plane of incidence.

The resist surface as the object to be exposed is known to have a light absorption rate higher for the TM wave incident light than for the TE wave incident light. In particular, TM wave with its incidence angle at the so-called Brewster's angle can provide the almost zero reflectance.

It has thus been attempted in the exposure apparatus to positively control the polarization state of the illumination light to change the imaging characteristics.

For example, Japanese Patent No. 3246615 discloses a method in which the illumination light is linearly polarized to form an image mainly with the TE wave. Japanese Patent No. 2836483 discloses a method in which the illumination light is linearly polarized to form an image mainly with the TM wave.

Optical elements of the illumination optical system may be contaminated, degenerated, or misaligned due to vibration, to change the polarization direction of the illumination light that has been set during the exposure apparatus assembly operation. Such a variation in the polarization direction of the illumination light can affect the imaging characteristics of the exposure apparatus. Before being used, such an exposure apparatus thus needs to be inspected for variation in the polarization direction, and the optical elements need to be appropriately cleaned depending on the inspection results.

In the conventional exposure apparatus, however, it has not been directly confirmed that the illumination light is not in the desired polarization state. In the conventional exposure apparatus, it is possible to detect the exposure latitude or depth of focus and the like from the exposure conditions of the resist and the like to determine that the desired imaging conditions are not provided. In the conventional exposure apparatus, however, it is not possible to directly determine the variation in the polarization direction, because various possible reasons other than the variation in the polarization direction of the illumination light may prevent the desired imaging conditions.

SUMMARY OF THE INVENTION

A mask for inspecting an exposure apparatus according to an embodiment of this invention is a mask for inspecting an exposure apparatus in which a photomask is held at a conjugate position which is optically conjugated with an object to be exposed and light flux for exposure from a light source is projected via the photomask onto the object to be exposed, comprising: a light-source-image-forming optical system disposed between the light source and the conjugate position; to form an image of the light source at the conjugate position; and a polarizing element disposed in a light path of light flux forming the light source image to selectively transmit light flux with a plurality of polarization directions, wherein the mask is held at a position of the photomask to inspect a polarization state of the light flux for exposure of the exposure apparatus.

A method of inspecting an exposure apparatus according to an embodiment of this invention is a method of inspecting an exposure apparatus which includes a light source generating light flux for exposure, a projection optical system projecting the light flux for exposure onto an object to be exposed, and a photomask with a mask pattern formed at an optically conjugate position which is optically conjugated by said projection optical system to said object to be exposed, the mask pattern being projected onto said object to be exposed, said method comprising: inserting between the light source and the conjugate position a light-source-image-forming optical system to form an image of the light source at the conjugate position, inserting a polarizer into a light path of light flux forming the light source image, and then projecting the light flux for exposure onto the object to be exposed via the light-source-image-forming optical system, the polarizer, and the projection optical system, with polarization-axis directions of the polarizer being changed; and determining a polarization state of the light flux for exposure by comparing a light intensity distribution of the light flux for exposure on the object to be exposed, the light intensity distribution being different for each of the polarization-axis directions.

An exposure apparatus according to an embodiment of this invention is an exposure apparatus including: a light source generating light flux for exposure toward an object to be exposed; a photomask with a mask pattern to be projected onto the object to be exposed; object-to-be-exposed holding member holding the object to be exposed; a projection optical system for projecting the light flux for exposure onto the object to be exposed; and photomask holding member holding the photomask at an optically conjugate position which is optically conjugated by the projection optical system to the object to be exposed, the exposure apparatus comprising, a mask for inspection held on the photomask holding member determining a polarization state of the light flux for exposure, wherein the mask for inspection comprises: a light-source-image-forming optical system located between the light source and the conjugate position to form an image of the light source at the conjugate position; and a polarizing element with a variable polarization-axis direction inserted in a light path of light flux forming the light source.

BRIEF DESCRIPTION OF THE DRAWINGS

FIG. 10A–10B shows a configuration of the inspection mask 50' according to the second embodiment of the present invention.

FIG. 11 shows an enlarged view of the light shielding pattern 53 and pinhole 44 included in the inspection mask 50'.

DETAILED DESCRIPTION OF THE INVENTION

The embodiments of the present invention will now be described in detail with reference to the accompanying drawings.

Figure 1:
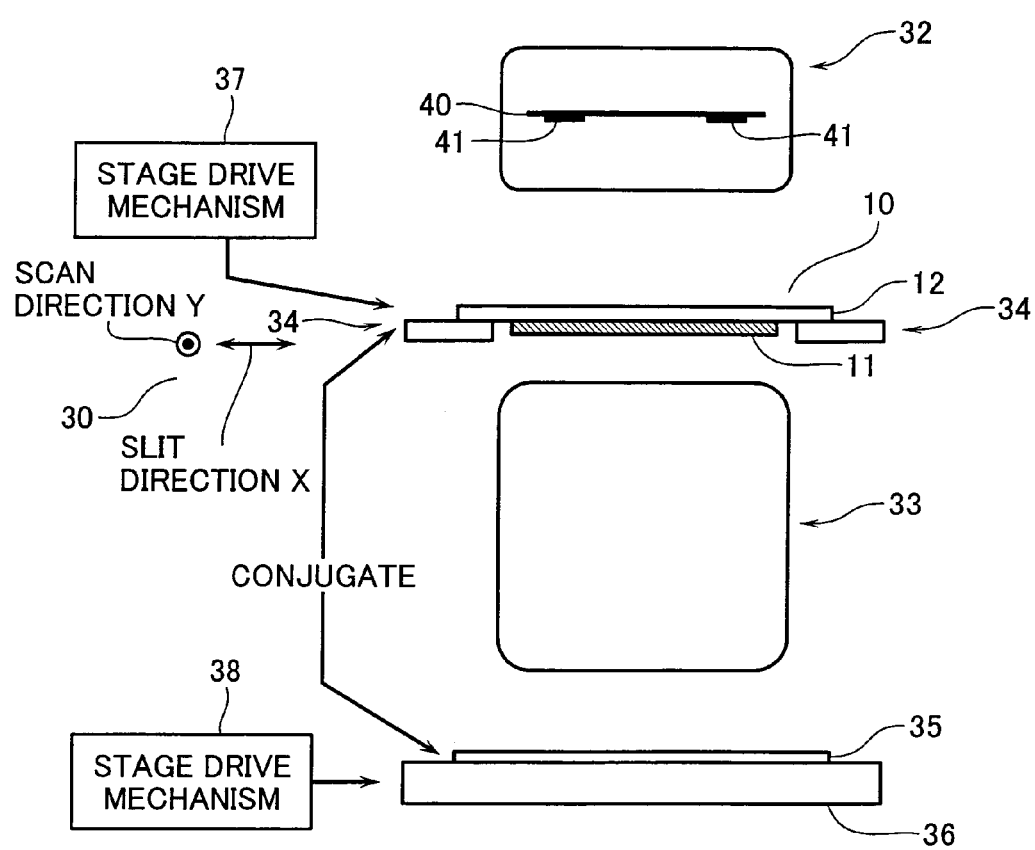
FIG. 1 shows a schematic configuration of an exposure apparatus 30 according to an embodiment of the present invention.

The exposure apparatus 30 according to an embodiment of the present invention comprises, as shown in FIG. 1, a not-shown light source, the illumination optical system 32, projection optical system 33, photomask stage 34, wafer stage 36, stage drive mechanism 37, and stage drive mechanism 38.

In this embodiment, the secondary light source 41 as the image of the not-shown light source is assumed to be formed in the secondary light source plane 40 in the illumination optical system 32. The secondary light source plane 40 is located in the entrance pupil plane of the projection optical system 33 or the plane optically conjugated thereto. The secondary light source 41 is assumed to be linearly polarized in a predetermined direction by a not-shown polarizer. For example, as shown in FIG. 2A, two secondary light sources 41 (dipole illumination) arranged symmetrically about the optical axis 49 generate, respectively, as shown by the arrows 42, the linearly polarized light with its polarization-axis direction being in the tangential direction of the circle centered on the optical axis 49 of the illumination optical system 32.

Figure 2A:
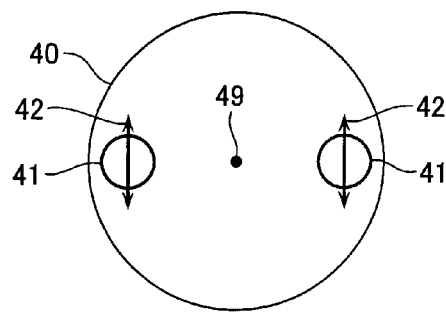
FIG. 2A–2F shows various examples of a configuration of a secondary light source surface 40.
Figure 2B:
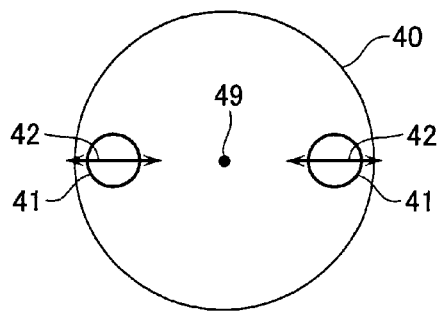
Figure 2C:
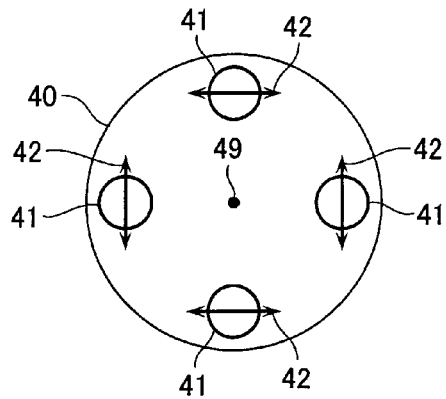
Figure 2D:
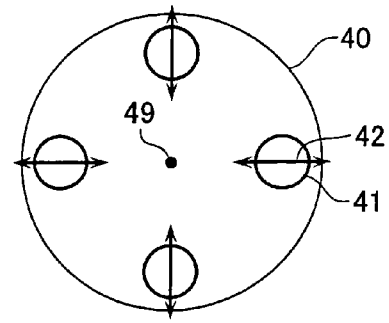

There are a variety of possible arrangements, numbers, and polarization-axis directions 42 of the secondary light sources 41 in the secondary light source plane 40, as shown in FIG. 2B–2F. FIG. 2B shows the same secondary light sources 41 with the dipole illumination as for FIG. 2A, except that the polarization-axis directions 42 are radially outward from the optical axis 49. FIG. 2C shows the same secondary light sources 41 with the polarization-axis directions 42 being in the tangential direction as for FIG. 2A, except that four secondary light sources 41 are provided in 90 degrees increments about the optical axis 49 (quadrupole illumination). FIG. 2D shows the same secondary light sources 41 with the quadrupole illumination as for FIG. 2C, except that the polarization-axis directions 42 are radially outward from the optical axis 49.

Figure 2E:
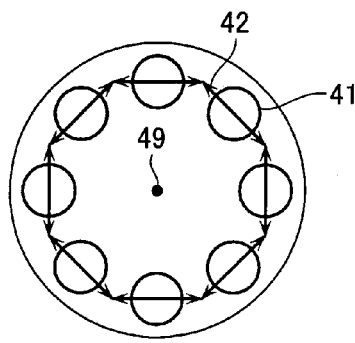
Figure 2F:
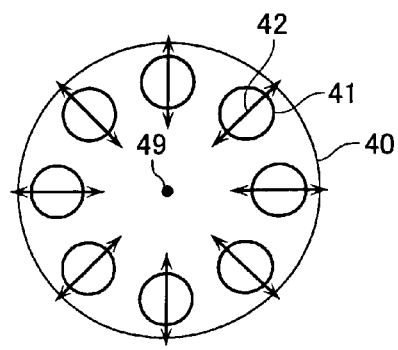

FIG. 2E shows the same secondary light sources 41 with the polarization-axis directions 42 in the tangential direction as for FIG. 2A, except that eight secondary light sources 41 are provided in 45 degrees increments about the optical axis 49 (octupole illumination). FIG. 2F shows the same secondary light sources 41 with the octupole illumination as for FIG. 2E, except that the polarization-axis directions 42 are radially outward from the optical axis 49. In the description below, the secondary light source plane 40 is assumed to be in the form of the dipole illumination (with the polarization-axis directions 42 in the tangential direction) shown in FIG. 2A.

Returning to FIG. 1, the photomask stage 34 is for holding the photomask 10. The photomask 10 comprises the pattern formation section 11 with the mask pattern to be projected on the wafer 35 (the mask pattern is here assumed to be slits with the longitudinal direction in the plane of FIG. 1 (the slit direction X)). The photomask 10 also comprises the glass substrate 12 attached on the backside of the pattern formation section 11. The photomask stage 34 holds the glass substrate 12 in such a way that the wafer 35 held on the wafer stage 36 is optically conjugated by the projection optical system 33 to the pattern formation section 11. The photomask stage 34 is configured to be movable by the stage drive mechanism 37 in the direction including the scan direction Y as shown in FIG. 1. The wafer stage 36 is also configured to be movable by the stage drive mechanism 38 in the direction including the scan direction Y. The secondary light source 41 uniformly illuminates the mask pattern formed in the pattern formation section 11, thereby projecting the mask pattern onto the wafer 35.

Figure 3A:
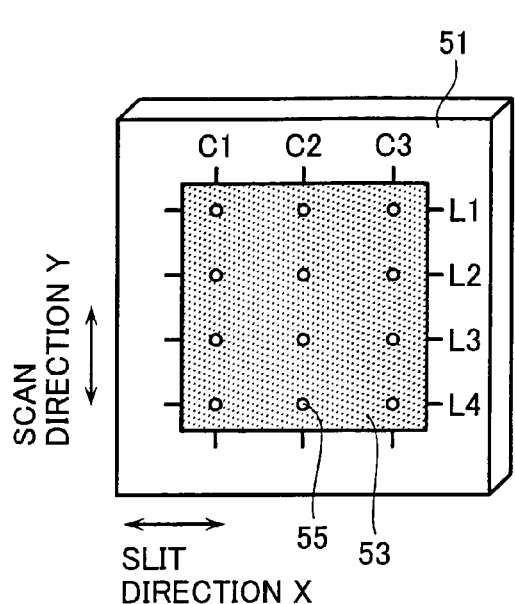
FIG. 3A–3B shows a configuration of the mask for inspection 50 according to the first embodiment of the present invention.
Figure 3B:
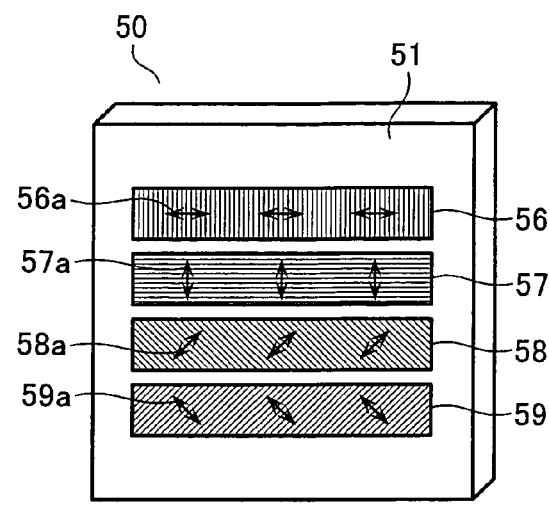
Figure 4:
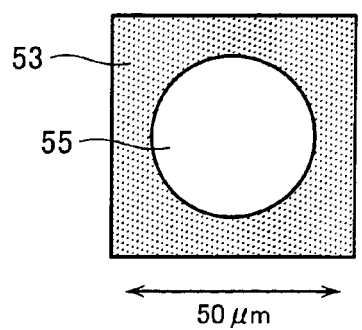
FIG. 4 shows an enlarged view of the light shielding pattern 53 and pinhole 55 included in the mask for inspection 50.
Figure 5:
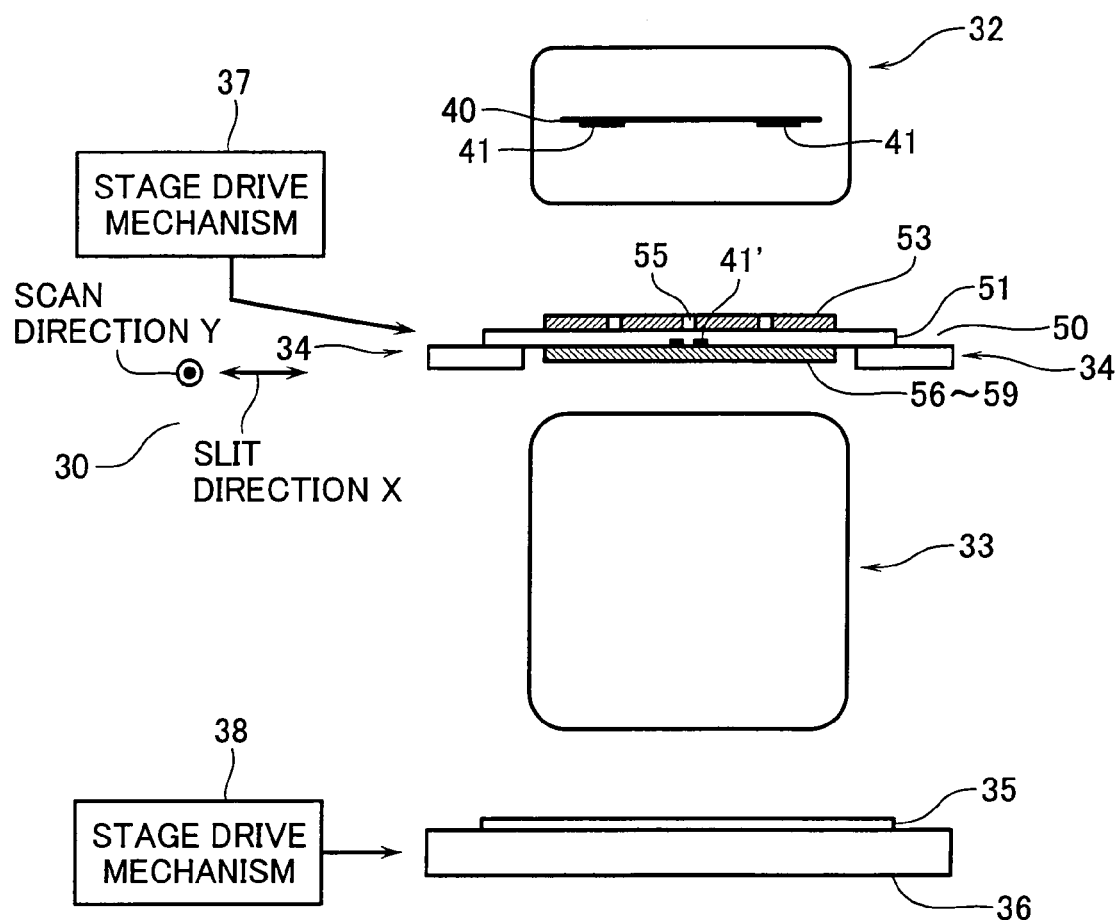
FIG. 5 shows an exposure apparatus 30 with the mask for inspection 50 held thereon.

This embodiment uses the inspection mask 50 as shown in FIGS. 3 and 4 to inspect whether the secondary light sources 41 in the exposure apparatus 30 have the desired polarization directions, as shown, for example, by the arrows 42 in FIG. 2A. The inspection mask 50 is held and used on the photomask stage 34, instead of the photomask 10, as shown in FIG. 5.

The inspection mask 50 according to this embodiment comprises the transparent substrate 51, as shown in FIG. 3. The transparent substrate 51 can have a thickness of, for example, about 6.35 mm, and can be made of materials such as fused silica and fluorite. The transparent substrate 51 has the front side surface (the surface on the wafer stage 36 side) that is optically conjugated by the projection optical system 33 to the wafer 35. The transparent substrate 51 thus has the backside surface (the surface on the secondary light source 41 side) that is spaced slightly apart from the conjugate position.

The transparent substrate 51 has the back side surface on which is fixedly provided the light shielding pattern 53 made of materials such as a chrome (Cr) deposited film. The light-shielding pattern 53 includes a plurality of pinholes 55 formed in a grid-like manner thereon. As shown in FIG. 3B, the light shielding pattern 53 is here assumed to include 12 (=3×4) pinholes 55 formed at the intersection points between the rows of L1–L4 along the slit direction X and the columns of C1–C3 along the scan direction Y. The illumination optical system 32 is assumed to be designed in such a way that the illumination light from the secondary light source 41 can only illuminate the three pinholes 55 arranged in one row Li (i=1–4) at the same time.

These pinholes 55 serve as a pinhole optical system which can form the image 41' of the secondary light source 41 near the front side surface of the transparent substrate 51, i.e., near the position which is optically conjugated to the wafer 35 by the projection optical system 33. Each pinhole 55 has a diameter of about 50 micron (um) on the light shielding pattern 53, as shown in FIG. 4.

The transparent substrate 51 also includes the polarizer patterns 56–59 formed on the front side thereof, as shown in FIG. 3B. The polarizer patterns 56–59 have polarization axes with different directions, each polarization axis being set to transmit only the portion of the illumination light from the secondary light source 41 that has a predetermined polarization direction. The polarizer patterns 56–59 are here assumed to have polarization axes 56a–59a which are at 0 degree, 90 degrees, 45 degrees, and 135 degrees, respectively, measured counterclockwise from the slit direction X, as shown in FIG. 3B.

To correspond to any of the rows L1–L4 of the three pinholes 55, each of the polarizer patterns 56–59, with its longitudinal direction being in the slit direction X, is fixedly formed on the front side of the transparent substrate 51. The mask for inspection 50 moves in the scan direction Y to insert the three pinholes 55 in one row Li into the illumination path of the secondary light source 41, with the corresponding one of the polarizer patterns 56–59 also being inserted into that illumination path.

Figure 6:
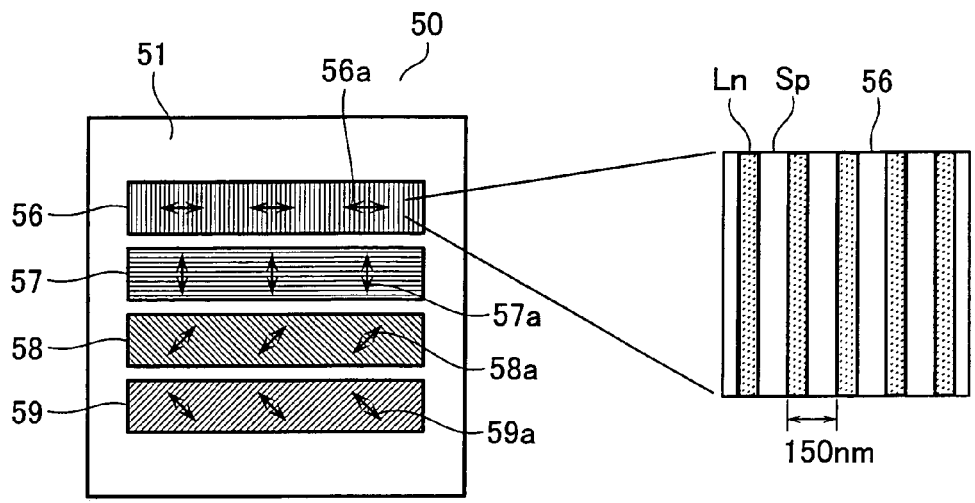
FIG. 6 shows structures of the polarizer patterns 56–59 of the inspection mask 50.
Figure 6:
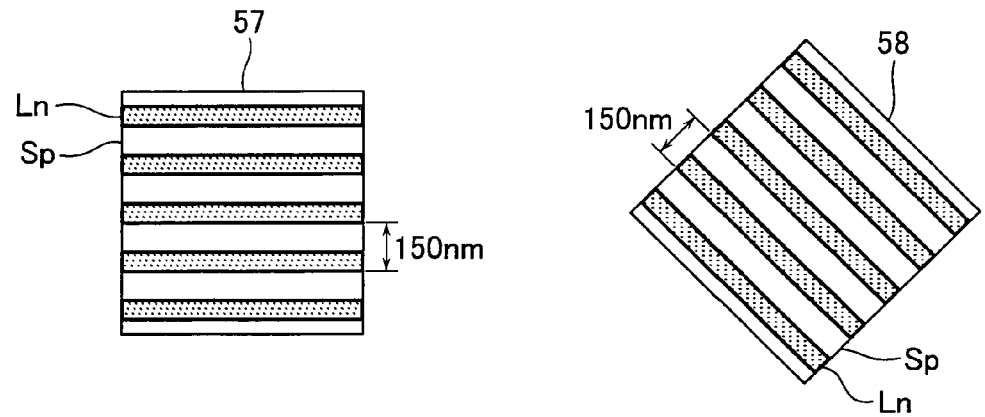
Figure 6:
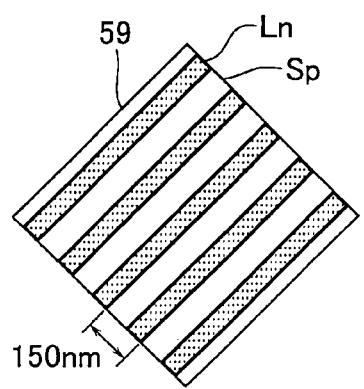

Each of the polarizer patterns 56–59 has a line and space pattern (L/S pattern) which includes alternately the light shielding portion Ln formed of a conductive metal film such as chrome (Cr) and the transmitting portion Sp, as shown in FIG. 6. It is assumed here that the ratio of the light shielding portion Ln and the transmitting portion Sp in the pitch period direction is about 1:1 and the pitch period is about 150 nm. For the exposure apparatus 30 that is an ArF exposure apparatus with the exposure wavelength of 193 nm, the pitch period can be smaller than the exposure wavelength, in which case such a structure is referred to as a wire grid polarizer. The wire grid polarizer can transmit light with its electric vector vibrating in the periodic direction of the L/S pattern including the light-shielding portion Ln and transmitting portion Sp at transmittance higher than that for the light vibrating perpendicularly to the periodic direction. A polarizer with a pitch period longer than the exposure wavelength but smaller than or equal to twice the exposure wavelength may be used in this method, since there is a difference at transmittance between the light with its electric vector vibrating in the periodic direction of the L/S pattern, and the light vibrating perpendicularly to the periodic direction.

Figure 7A:
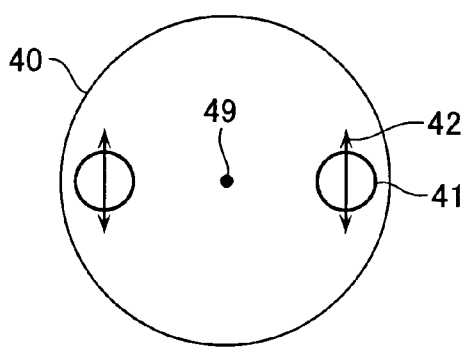
FIG. 7A–7E shows how to inspect the exposure apparatus 30 using the inspection mask 50.

The procedure for inspecting the exposure apparatus 30 using such a mask for inspection 50 will now be described with reference to FIG. 7A–7E. The secondary light source plane 40 is here assumed to be the dipole illumination as shown in FIG. 7A, with its polarization-axis direction 42 extending in the tangential direction of the circle centered on the optical axis 49. The wafer stage 36 is assumed to hold the wafer 35 with the resist applied thereon.

Figure 7B:
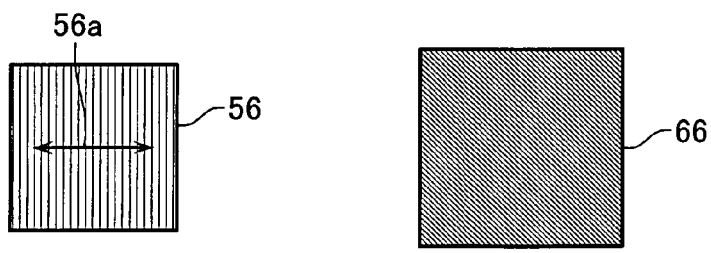
Figure 7C:
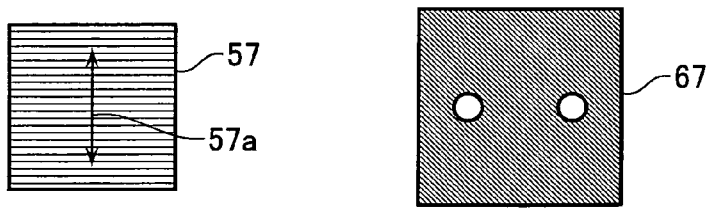
Figure 7D:
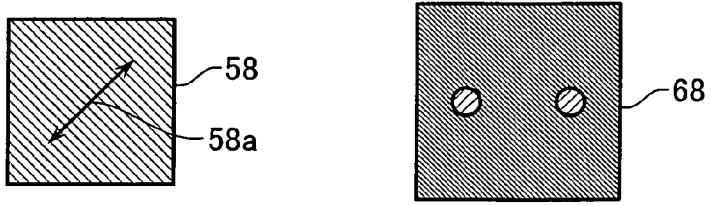

First, the polarizer pattern 56 (with the polarization axis 56a at 0 degree) and the pinholes 55 in the row L1 are used to project the image 41' of the secondary light source 41 onto the resist at a predetermined exposure dose D1, as shown in the left-hand drawing in FIG. 7B. In this case, given the secondary light source 41 that has the polarization-axis direction 42 oriented in the tangential direction as shown in FIG. 7A, the polarization-axis direction 42 is perpendicular to the polarization axis 56a so that the polarizer pattern 56 can transmit little light from the secondary light source 41. No image 41' of the secondary light source 41 can thus be formed at the exposure position 66 on the resist, as shown in the right-hand drawing in FIG. 7B.

The stage drive mechanism 37 then moves the polarizer pattern 57 (with the polarization axis 57a at 90 degrees) and the pinholes 55 in the row L2 to be used to project the image 41' of the secondary light source 41 onto the resist at the exposure dose D1 (the same exposure as for the polarizer pattern 56), as shown in the left-hand drawing in FIG. 7A. The stage drive mechanism 38 moves the exposure position 67 for the polarizer pattern 57 to a different position from the above-described exposure position 66. For the exposure through the polarizer pattern 57, given the secondary light source 41 that has the polarization-axis direction 42 as shown in FIG. 7A, the polarization-axis direction 42 can be identical with the polarization axis 57a. The polarizer pattern 57 can thus transmit all the light from the secondary light source 41. The clear images 41' of the secondary light source 41 can thus be developed at the exposure position 67, as shown in the right-hand drawing in FIG. 7C.

Figure 8:
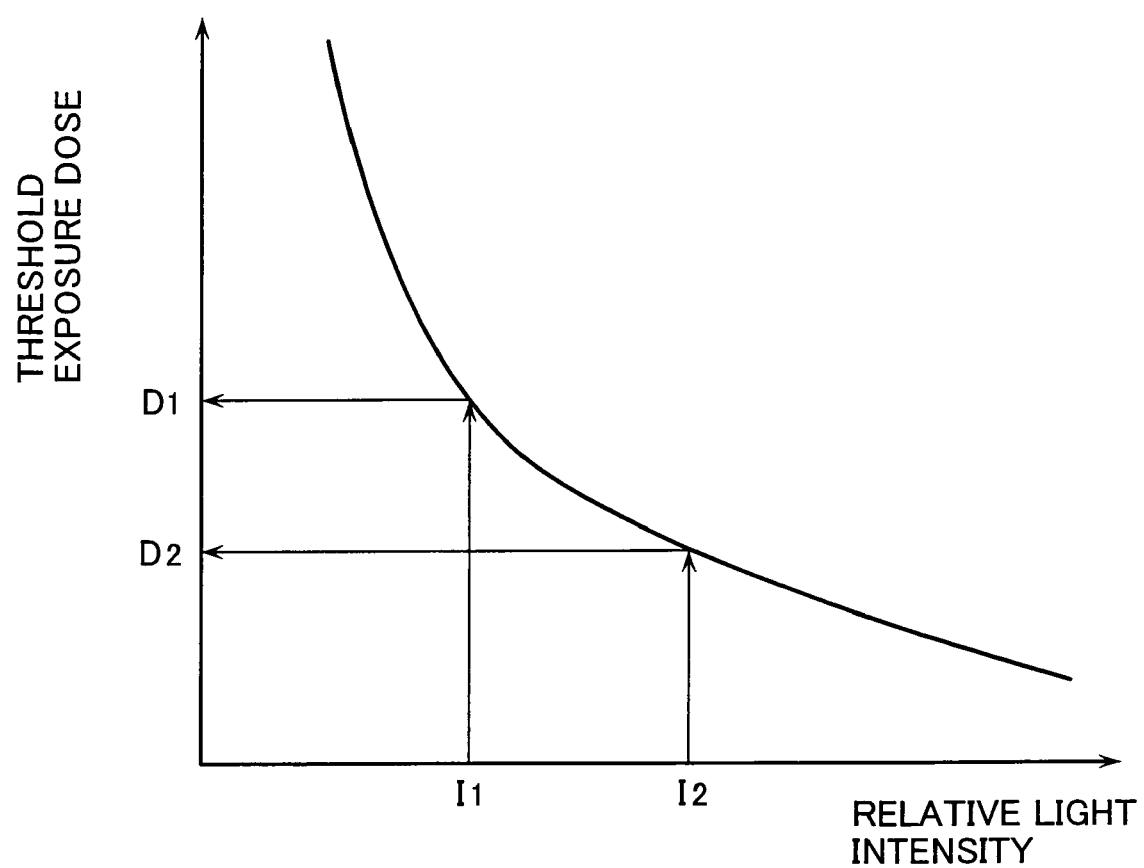
FIG. 8 shows a graph illustrating the relationship between the relative light intensity of the secondary light source 41 and the minimum exposure dose (threshold exposure dose) applied on the wafer 35 required to expose the wafer 35 after resist development.

For the polarizer pattern 57 used, the exposure dose D1 can also be set at the minimum exposure dose (threshold exposure dose) of the resist applied on the wafer 35 required to expose the wafer 35 after resist development. The relative light intensity I of the illumination light from the secondary light source 41 has such a relationship with the threshold exposure dose D as shown in the graph in FIG. 8. The graph shows that the threshold exposure dose can be set at D1 for the relative light intensity I that is assumed to be I1.

The stage drive mechanism 37 then moves the polarizer pattern 58 (with the polarization axis 58a at 45 degrees) and the pinholes 55 in the row L3 to be used to project the image 41' of the secondary light source 41 onto the resist at the exposure dose D1, as shown in the left-hand drawing in FIG. 7 (d). The stage drive mechanism 38 moves the exposure position 68 for the polarizer pattern 58 to a different position from the above-described exposure positions 66 and 67. In this case, given the secondary light source 41 that has the polarization-axis direction 42 as shown in FIG. 7A, the polarization-axis direction 42 differs from the polarization axis 58a by 45 degrees so that the polarizer pattern 58 can transmit $(1/2)^{1/2}$ (=cos (45 degrees)) of the light from the secondary light source 41. The images 41' of the secondary light source 41 can thus be developed at the exposure position 68, although the resist has a smaller degree of exposure than that for the exposure position 67, as shown in the right-hand drawing in FIG. 7D. Specifically, at the exposure position 67, the resist can be removed, for example, to the bottom, while, at the exposure position 68, the resist can only be removed to a shallow depth.

Figure 7E:
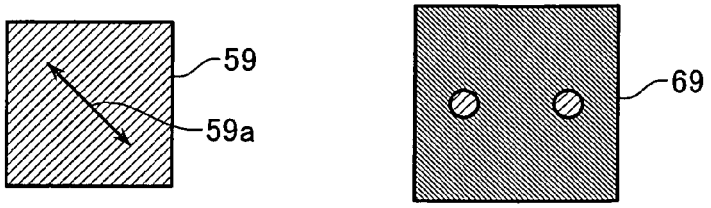

Finally, the stage drive mechanism 37 moves the polarizer pattern 59 (with the polarization axis 59a at 135 degrees) and the pinholes 55 in the row L4 to be used to project the image 41' of the secondary light source 41 onto the resist at the exposure dose D1, as shown in the left-hand drawing in FIG. 7E. The stage drive mechanism 38 moves the exposure position 69 for the polarizer pattern 59 to a different position from the above-described exposure positions 66–68. In this case, given the secondary light source 41 that has the polarization-axis direction 42 as shown in FIG. 7A, the polarization-axis direction 42 differs from the polarization axis 59a by 135 degrees. The polarizer pattern 59 can thus transmit $(1/2)^{1/2}$ (=cos (180 degrees–135 degrees)) of the light from the secondary light source 41, as for the polarizer pattern 58. Thus, given the secondary light source 41 that has the polarization-axis direction as shown in FIG. 7A, the resist has the same degree of exposure at the exposure position 68 and the exposure position 69.

The conditions of the wafer 35 thus exposed are compared at the exposure positions 66–69 to determine whether the secondary light source 41 has the desired polarization direction. Specifically, the image analysis or a variety of non-contact measuring equipment and the like are used to determine the development conditions of the resist at the exposure positions 66–69.

Given the secondary light source 41 that has the polarization-axis direction 42 as shown in FIG. 7A, the conditions at the exposure positions 66–69 will be as shown in FIG. 7B–7E. For the conditions being not as shown in FIG. 7B–7E, therefore, the polarization-axis direction 42 can be determined not to be the desired one. For example, for the resist not being removed to the bottom surface thereof at the exposure position 67, or for the different amount of the resist being removed at the exposure positions 68 and 69, the polarization-axis direction 42 can be determined not to be the desired one.

Figure 9A:
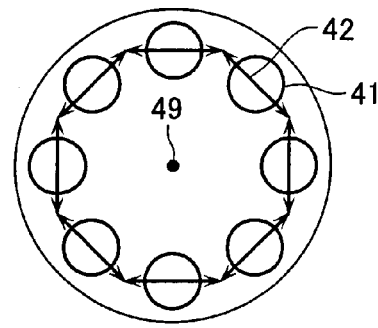
FIG. 9A–9E shows how to inspect the exposure apparatus 30 using the inspection mask 50.
Figure 9B:
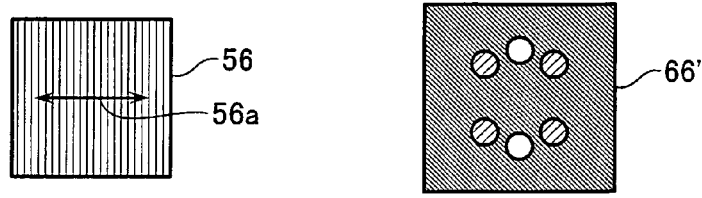
Figure 9C:
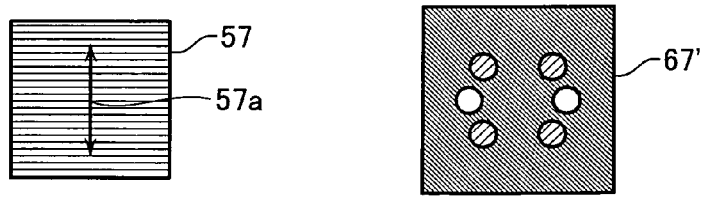
Figure 9D:
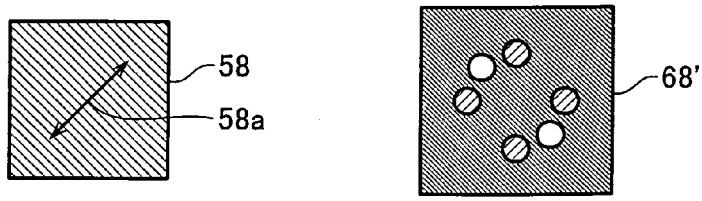
Figure 9E:
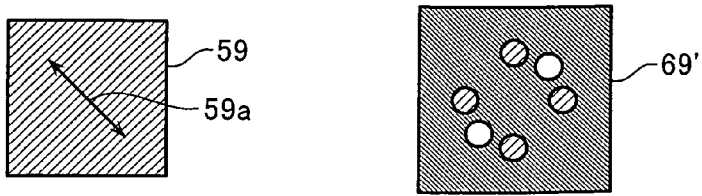

If, as shown in FIG. 9A, the octupole illumination is used in which the polarization-axis direction 42 is the tangential direction of a circle (with the center point 49) and the polarizer patterns 56–59 are used to expose the wafer 35, the exposure conditions at the exposure positions 66'–69' will be as shown in FIG. 9B–9E. For these exposure conditions being not obtained, the polarization-axis direction 42 can be determined not to be oriented in the desired one.

The second embodiment of the present invention will now be described with reference to FIGS. 10A, 10B and FIG. 11. The mask for inspection 50' according to the second embodiment is different from the mask 50 according to the first embodiment in that, as shown in FIG. 10A, the polarizer patterns 81–84 as well as the light shielding pattern 53 are formed together on the back side of the transparent substrate 51, and, as shown in FIG. 11, the pinholes 55 and the polarizer patterns 81–84 overlap one another. The method of inspecting the polarization-axis direction of the secondary light source 41 and the like are the same in the first embodiment.

Figure 12A:
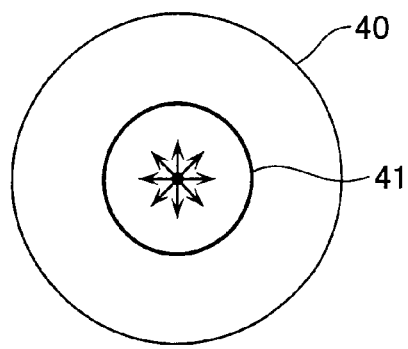
FIG. 12A–12E shows how to inspect the polarization state of the secondary light source 41 of the natural polarization (random polarization).
Figure 12B:
Figure 12C:
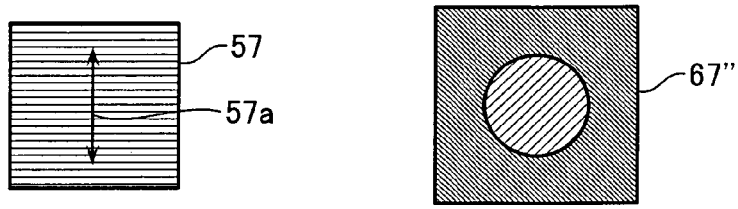
Figure 12D:
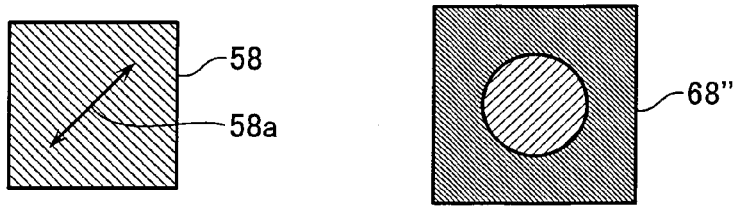
Figure 12E:
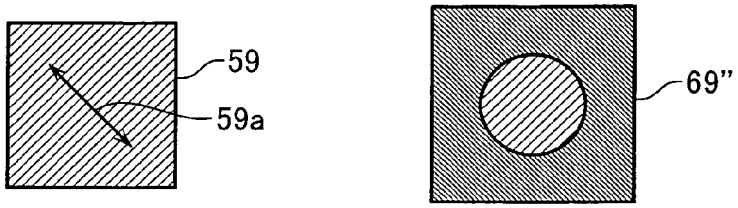

Thus, although the invention has been described with reference to particular embodiments thereof, it is not limited to those embodiments. For example, although the secondary light source 41 in the above embodiments is described as being polarized, the present invention can also be used to inspect whether the secondary light source 41 with natural polarization (random polarization) is actually projecting light with the random polarization, as shown in FIG. 12A. Specifically, as shown in FIG. 12B–12E, the polarizer patterns 56–59 can be used to expose the wafer 35 at the exposure positions 66"–69", respectively, to inspect the secondary light source 41 with the random polarization. Given the secondary light source 41 that actually has the random polarization, almost the same exposure conditions will occur at the exposure positions 66"–69". Given the different exposure conditions occurring, the secondary light source 41 can be determined not to have the random polarization.

Figure 13:
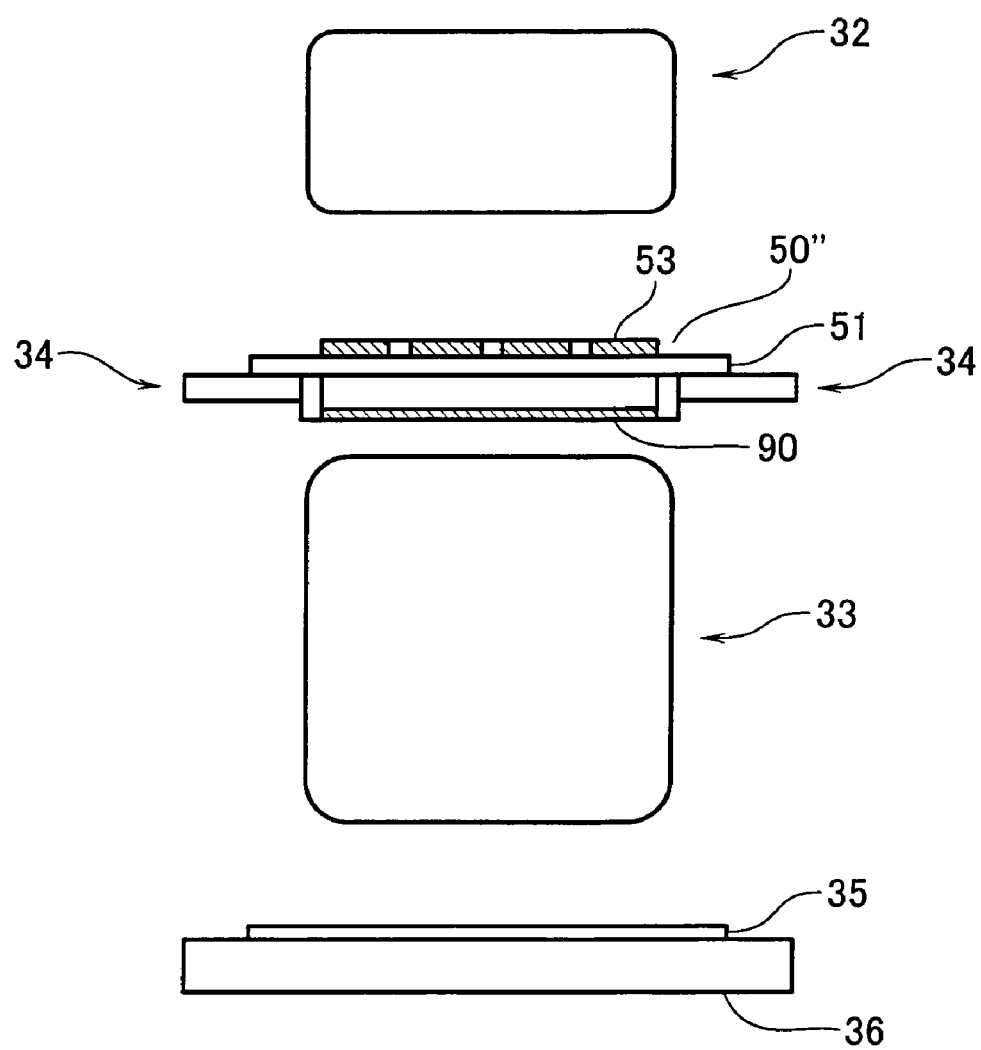
FIG. 13 shows a configuration of the inspection mask 50" as a modified example of the embodiment.
Figure 14:
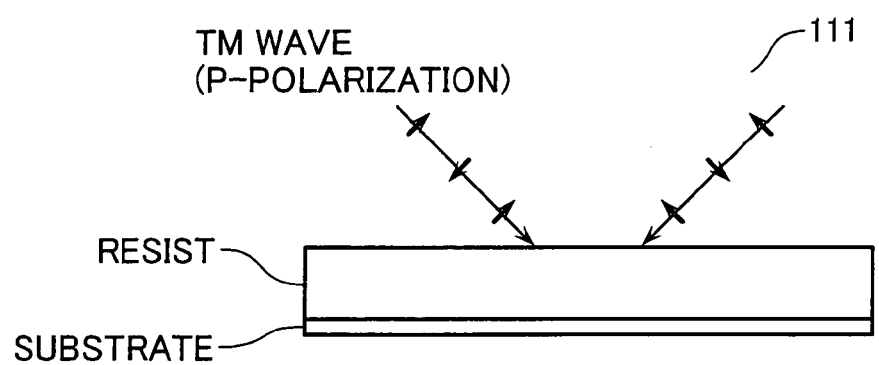
FIG. 14 illustrates the difference between TM wave 111 (p-polarization) projection light and TE wave 112 (s-polarization) projection light.
Figure 14:
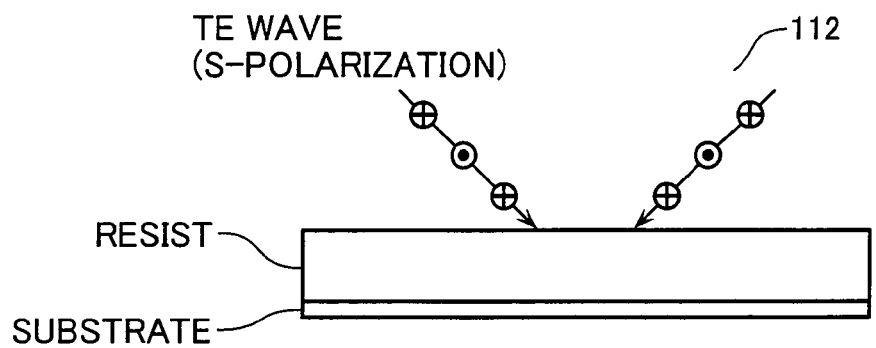

The above embodiments also have the polarizer patterns 56–59 formed on the front side of the transparent substrate 51. The polarizer patterns 56–59 may, however, be located at any position through which the light flux through the pinholes 55 for forming the image 41' of the secondary light source 41 passes. For example, the polarizer patterns may be located on the pellicle 90 for protecting the transparent substrate 51, as shown in FIG. 13. In this case, the pellicle 90 may preferably be shielded in the vicinity of an area through which the light flux for forming the image of the secondary light source 41 passes.

The light-shielding pattern 53 with the pinholes 55 may also not necessarily be formed on the backside of the transparent substrate 51. The light shielding pattern 53 may, in short, be formed at any position that allows the image 41' of the secondary light source 41 to be formed at the optically conjugate position to the wafer 35. For example, the pellicle for protecting the transparent substrate 51 may be provided on the secondary light source 41 side of the substrate 51, and the light-shielding pattern 53 with pinholes 55 may be formed on the pellicle.

The above embodiments also use the light-shielding pattern 53 with pinholes 55 to form the image of the secondary light source 41 at the optically conjugate position to the wafer 35. Any optical system can, in short, be used that can form the image 41' of the secondary light source 41 at the optically conjugate position to the wafer 35. For example, the microlens array can be used.

In the above embodiments, the sets of three pinholes 55 (rows L1–L4) are fixedly formed, with each set corresponding to each of the polarizer patterns 56–59. Only one row of three pinholes 55 can, however, be provided and the polarizer patterns 56–59 can be selectively moved in front of the one row of three pinholes 55.

Only one polarizer pattern may be provided that can be rotated to change the polarization-axis direction.

The above embodiments also use the wafer 35 with the resist applied thereon to inspect the polarization-axis direction 42 of the secondary light source 41. Alternatively, the image pickup device such as CCD can be held on the wafer stage 36 and the image signal from the device may be used as the basis to determine the polarization-axis direction 42.

What is claimed is:

1. A mask for inspecting an exposure apparatus in which a photomask is held at a position which is optically conjugated with an object to be exposed and light flux for exposure from a light source is projected via said photomask onto said object to be exposed, comprising:
    an optical system disposed between said light source and said position to form an image of said light source at said position; and
    a polarizing element disposed in a light path of light flux forming said image of said light source to selectively transmit light flux with a plurality of polarization-axis directions,
    wherein the mask is held at said position in place of the photomask to inspect a polarization state of the light flux for exposure of the exposure apparatus.

2. A mask for inspecting an exposure apparatus according to claim 1, wherein said polarizing element comprises a plurality of polarizers with different polarization-axis directions, and the plurality of polarizers are selectively inserted into said light path.

3. A mask for inspecting an exposure apparatus according to claim 1, wherein said polarization-axis directions are 0 degree, 45 degrees, 90 degrees, and 135 degrees.

4. A mask for inspecting an exposure apparatus according to claim 2, wherein said optical system is provided for each of said plurality of polarizers.

5. A mask for inspecting an exposure apparatus according to claim 1, wherein said optical system is a pinhole forming said light source image at said position.

6. A mask for inspecting an exposure apparatus according to claim 1, further comprising a transparent substrate with its front side surface at said position, said front side surface facing said object to be exposed, wherein said optical system is formed on a back side of said transparent substrate, and said polarizing element is formed on said front side of said transparent substrate.

7. A mask for inspecting an exposure apparatus according to claim 1, further comprising: a transparent substrate with its front side surface being identical with said position, said front side surface being on the side of said object to be exposed; and a pellicle protecting the transparent substrate, wherein said forming optical system is formed on a back side of said transparent substrate, and said polarizing element is formed on said pellicle.

8. A mask for inspecting an exposure apparatus according to claim 1, further comprising:
a transparent substrate;
and a pellicle protecting the transparent substrate,
wherein said optical system is formed on said pellicle, and said polarizing element is formed on said transparent substrate.

9. A mask for inspecting an exposure apparatus according to claim 1, wherein said polarizing element includes a light transmitting portion and a light shielding portion made of conductive metal, which are formed alternately at a predetermined pitch period, and the pitch period is smaller than or equal to twice a wavelength of said light flux for exposure.

10. A mask for inspecting an exposure apparatus according to claim 1, wherein a plurality of said optical systems are formed along a shape of a slit formed on said photomask.

11. A method of inspecting an exposure apparatus which includes a light source generating light flux for exposure, a projection optical system projecting the light flux for exposure onto an object to be exposed, and a photomask with a mask pattern formed at a position which is optically conjugated by said projection optical system to said object to be exposed, the mask pattern being projected onto said object to be exposed, said method comprising:
inserting between said light source and said position an optical system to form an image of said light source at said position,
inserting a polarizer into a light path of light flux forming the light source image, and then
projecting said light flux for exposure onto said object to be exposed via said optical system, said polarizer, and said projection optical system, with the polarization-axis direction of said polarizer being changed; and
determining a polarization state of said light flux for exposure by comparing a light intensity distribution of said light flux for exposure on said object to be exposed, said light intensity distribution being different for each of said polarization-axis directions.

12. A method of inspecting an exposure apparatus according to claim 11, wherein said polarization state of said light flux for exposure is determined by comparing said light intensity distribution based on exposure conditions of a resist applied on said object to be exposed.

13. A method of inspecting an exposure apparatus according to claim 11, wherein said polarization state of said light flux for exposure is determined by comparing a light intensity distribution detected by an image pickup device which is disposed as said object to be exposed.

14. A method of inspecting an exposure apparatus according to claim 11, wherein a plurality of polarizers with different polarization-axis directions are prepared, and these plurality of polarizers are selectively inserted into said light path.

15. A method of inspecting an exposure apparatus according to claim 11, wherein said optical system is a pinhole forming said light source image at said conjugate position.

16. An exposure apparatus including:
a light source generating light flux for exposure toward an object to be exposed;
an object holding member holding said object to be exposed;
a projection optical system projecting the light flux for exposure onto said object to be exposed; and
a photomask holding member holding a photomask at a position which is optically conjugated by said projection optical system to said object to be exposed,
said exposure apparatus comprising,
a mask for inspection held on said photomask holding member in place of said photomask and determining a polarization state of said light flux for exposure, wherein
the mask for inspection comprises:
a an optical system located between said light source and said position to form an image of said light source at said position; and
a polarizing element with a variable polarization-axis direction inserted in a light path of light flux forming said light source.

17. An exposure apparatus according to claim 16, wherein said polarizing element comprises a plurality of polarizers with different polarization-axis directions, and the plurality of polarizers are selectively inserted into said light path.

18. An exposure apparatus according to claim 17, wherein said optical system is provided for each of said plurality of polarizers.

19. An exposure apparatus according to claim 16, wherein said optical system is a pinhole forming said light source image at said position.

20. An exposure apparatus according to claim 16, wherein said polarizing element includes a light transmitting portion and a light shielding portion made of conductive metal, which are formed alternately at a predetermined pitch period, and the pitch period is smaller than or equal to twice a wavelength of said light flux for exposure.

* * * * *